(12) United States Patent
Mitsuishi et al.

(10) Patent No.: US 8,237,350 B2
(45) Date of Patent: Aug. 7, 2012

(54) LIGHT-EMITTING DEVICE

(75) Inventors: Iwao Mitsuishi, Machida (JP); Shinya Nunoue, Ichikawa (JP); Yasushi Hattori, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/985,955

(22) Filed: Jan. 6, 2011

(65) Prior Publication Data

US 2011/0101851 A1    May 5, 2011

Related U.S. Application Data

(62) Division of application No. 12/143,382, filed on Jun. 20, 2008, now Pat. No. 7,884,538.

(30) Foreign Application Priority Data

Aug. 31, 2007    (JP) .................................. 2007-225887

(51) Int. Cl.
*H01J 1/62*    (2006.01)
(52) U.S. Cl. ........ 313/502; 313/501; 313/503; 313/506; 313/512
(58) Field of Classification Search ........... 313/498–512
See application file for complete search history.

(56) References Cited

U.S. PATENT DOCUMENTS

| 7,781,958 | B2 | 8/2010 | Hattori et al. |
| 2003/0089919 | A1 | 5/2003 | Ishii et al. |
| 2004/0217692 | A1 | 11/2004 | Cho et al. |
| 2005/0117357 | A1 | 6/2005 | Ishii et al. |
| 2005/0184298 | A1 | 8/2005 | Ueda |
| 2005/0253158 | A1 | 11/2005 | Yasukawa et al. |
| 2006/0139926 | A1 | 6/2006 | Morioka et al. |
| 2007/0102717 | A1 | 5/2007 | Lee et al. |
| 2007/0194685 | A1 | 8/2007 | Hirosaki |
| 2007/0210326 | A1 | 9/2007 | Kurihara |
| 2007/0215890 | A1 | 9/2007 | Harbers et al. |
| 2007/0228390 | A1 | 10/2007 | Hattori et al. |
| 2008/0023712 | A1 | 1/2008 | Mueller et al. |
| 2008/0105887 | A1 | 5/2008 | Narendran et al. |

(Continued)

FOREIGN PATENT DOCUMENTS

JP    2000-509912    8/2000

(Continued)

OTHER PUBLICATIONS

Office Action issued Apr. 3, 2012 in Japanese Application No. 2007-225887 filed Aug. 31, 2007 (w/English translation).

*Primary Examiner* — Bumsuk Won
(74) *Attorney, Agent, or Firm* — Oblon, Spivak, McClelland, Maier & Neustadt, L.L.P.

(57) ABSTRACT

A light-emitting device includes a package having, on a surface thereof, a first portion surrounded by a second portion; a semiconductor blue color light-emitting element mounted on the first portion; a first transparent resin layer covering the semiconductor blue color light-emitting element and contacted with the first and second portions. The first transparent resin layer in cross section has an arch-like outer profile. A laminated body having in cross section an arch-like profile is formed on the first transparent resin layer with end faces of the laminated body being contacted with the second portion, and includes in order a red fluorescent layer, a yellow fluorescent layer, a second transparent resin layer and a green fluorescent layer, the second transparent resin layer having a center portion disposed between end face portions, the center portion having a larger thickness than thicknesses of the end face portions.

5 Claims, 4 Drawing Sheets

U.S. PATENT DOCUMENTS

| | | |
|---|---|---|
| 2010/0051988 A1 | 3/2010 | Mitsuishi et al. |
| 2010/0172388 A1 | 7/2010 | Hwang et al. |
| 2010/0246628 A1 | 9/2010 | Hattori et al. |

FOREIGN PATENT DOCUMENTS

| | | |
|---|---|---|
| JP | 2005-277127 | 10/2005 |
| JP | 2006-148147 | 6/2006 |
| JP | 2007-80872 | 3/2007 |

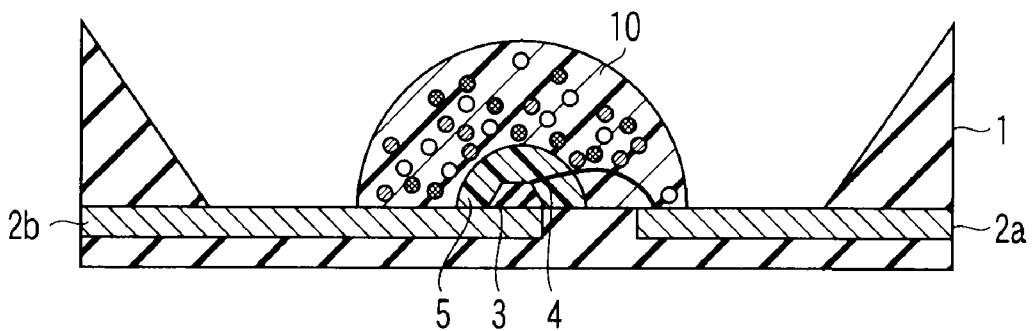
F I G. 9
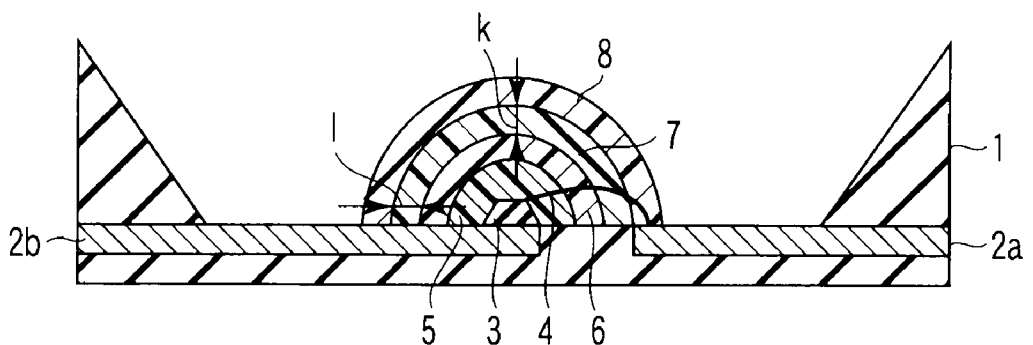
F I G. 10
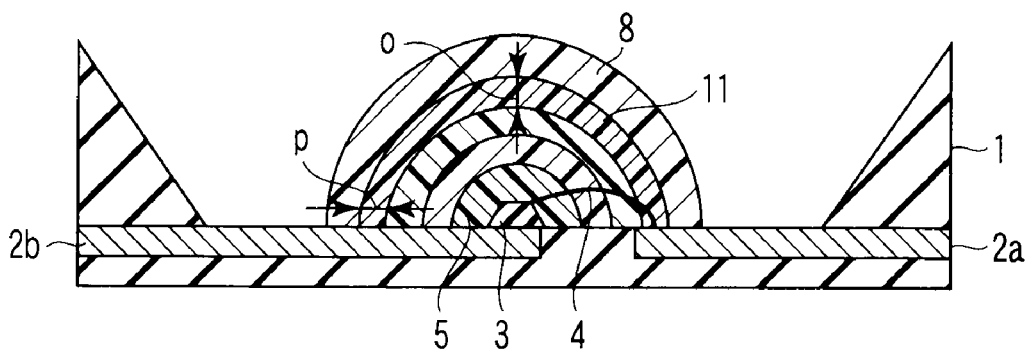
F I G. 11

LIGHT-EMITTING DEVICE

CROSS-REFERENCE TO RELATED APPLICATIONS

This application is a division of and claims the benefit of priority under 35 U.S.C. §120 from U.S. Ser. No. 12/143,382 filed Jun. 20, 2008, and claims the benefit of priority under 35 U.S.C. §119 from Japanese Patent Application No. 2007-225887 filed Aug. 31, 2007, the entire contents of each of which are incorporated herein by reference.

BACKGROUND OF THE INVENTION

1. Field of the Invention

This invention relates to a light-emitting diode (hereinafter referred to as LED) and a light-emitting device employing a semiconductor light-emitting element such as a semiconductor laser diode (hereinafter referred to as LD).

2. Description of the Related Art

In recent years, much attention has been paid to so-called white LEDs, where white light is emitted using a single chip comprising a combination of a blue LED employed as an excitation light source and a yellow fluorescent substance such as YAG:Ce. Although this white LED is simple in construction, the white color to be emitted therefrom is poor in a red component. Because of this, the white light obtained from a combination consisting of only the blue emission to be derived from an excitation light source and the yellow fluorescent substance has been realized as being defective in that it lacks in color rendering. Therefore, this white light is accompanied with a problem that it is difficult to apply it for ordinary illumination or as a backlight for a liquid crystal display where high color rendering is demanded.

This problem may be overcome by the co-use of a red fluorescent substance. For example, it is possible to obtain an emission color which is excellent in color reproducibility using a combination of a green fluorescent substance and a red fluorescent substance with a blue LED. As the green fluorescent substance, it is possible to employ (Sr, Ca, Ba)(Al, Ga)$_2$S$_4$:Eu, BaMgAl$_{10}$O$_{17}$:Eu, etc. As the red fluorescent substance, it is possible to employ (Ca, Sr)S:Eu, CaLa$_2$S$_4$:Ce, etc.

There is also proposed a light-emitting device in JP-A 2000-509912 (KOHYO) wherein a blue fluorescent substance, a green fluorescent substance and a red fluorescent substance are used in combination with an ultraviolet LED. Since the color of emission to be obtained depends only on the mixing ratio of fluorescent substances, the preparation of the light-emitting device would appear to be simple. Therefore, as far as the color rendering is concerned, this light-emitting device is more excellent than the light-emitting device to be obtained from a blue LED which is combined with only a yellow fluorescent substance.

When several kinds of fluorescent substances are employed, there is the possibility that fluorescence may be re-absorbed. There is also proposed a light-emitting device in JP-A 2005-277127 (KOKAI) wherein a plurality of fluorescent substances each differing in fluorescent wavelength emitted are disposed along the route of light to be emitted externally from an excitation element in such an order that the fluorescent substance exhibiting a longer fluorescent wavelength is arranged more close to the excitation element, thereby suppressing the re-absorption of fluorescence. Specifically, a layer of fluorescent substance emitting a long wavelength (a wavelength closer to red color) is disposed in the vicinity of the excitation element and a layer of fluorescent substance emitting a short wavelength (a wavelength closer to blue color) is disposed at an outer position located away from the excitation element, thereby suppressing the re-absorption of fluorescence and enhancing the brightness of the light.

BRIEF SUMMARY OF THE INVENTION

A light-emitting device according to one aspect of the present invention comprises:

a package having, on a surface thereof, a first portion and a second portion surrounding the first portion;

a semiconductor light-emitting element mounted on the first portion and emitting a light having an emission peak at a near-ultraviolet region;

a transparent resin layer covering the semiconductor light-emitting element and contacted with the first portion and the second portion, the transparent resin layer having an arch-like outer profile, as seen in a cross section when cut perpendicularly to the surface; and a laminated body formed on the transparent resin layer with end faces of the laminated body being contacted with the second portion, the laminated body having an arch-like outer profile, as seen in a cross section when cut perpendicularly to the surface and comprising a red fluorescent layer, a yellow fluorescent layer, a green fluorescent layer and a blue fluorescent layer which are laminated in the mentioned order, the yellow fluorescent layer having a center portion larger in thickness than that of the end face portions thereof.

A light-emitting device according to another aspect of the present invention comprises:

a package having, on a surface thereof, a first portion and a second portion surrounding the first portion;

a semiconductor light-emitting element mounted on the first portion and emitting a light having an emission peak at a near-ultraviolet region;

a first transparent resin layer covering the semiconductor light-emitting element and contacted with the first portion and the second portion, the first transparent resin layer having an arch-like outer profile, as seen in a cross section when cut perpendicularly to the surface; and a laminated body formed on the first transparent resin layer with end faces of the laminated body being contacted with the second portion, the laminated body having an arch-like outer profile, as seen in a cross section when cut perpendicularly to the surface and comprising a red fluorescent layer, a yellow fluorescent layer, a second transparent resin layer, a green fluorescent layer and a blue fluorescent layer which are laminated in the mentioned order, the second transparent resin layer having a center portion larger in thickness than that of the end face portions thereof.

A light-emitting device according to a further aspect of the present invention comprises:

a package having, on a surface thereof, a first portion and a second portion surrounding the first portion;

a semiconductor light-emitting element mounted on the first portion and emitting a light having an emission peak at a blue color region;

a transparent resin layer covering the semiconductor light-emitting element and contacted with the first portion and the second portion, the transparent resin layer having an arch-like outer profile, as seen in a cross section when cut perpendicularly to the surface; and a laminated body formed on the transparent resin layer with end faces of the laminated body being contacted with the second portion, the laminated body having an arch-like outer profile, as seen in a cross section when cut perpendicularly to the surface and comprising a red fluorescent layer, a yellow fluorescent layer and a green fluorescent layer which are laminated in the mentioned order, the yellow fluorescent layer having a center portion made larger in thickness than that of the end face portions thereof.

A light-emitting device according to a further aspect of the present invention comprises:

a package having, on a surface thereof, a first portion and a second portion surrounding the first portion;

a semiconductor light-emitting element mounted on the first portion and emitting a light having an emission peak at a blue color region;

a first transparent resin layer covering the semiconductor light-emitting element and contacted with the first portion and the second portion, the first transparent resin layer having an arch-like outer profile, as seen in a cross section when cut perpendicularly to the surface; and a laminated body formed on the first transparent resin layer with end faces of the laminated body being contacted with the second portion, the laminated body having an arch-like outer profile, as seen in a cross section when cut perpendicularly to the surface and comprising a red fluorescent layer, a yellow fluorescent layer, a second transparent resin layer and a green fluorescent layer which are laminated in the mentioned order, the second transparent resin layer having a top portion made larger in thickness than that of the end face portions thereof.

BRIEF DESCRIPTION OF THE SEVERAL VIEWS OF THE DRAWING

FIG. 9 is a cross-sectional view of a light-emitting device of a further comparative example;

FIG. 10 is a cross-sectional view of a light-emitting device of a further comparative example; and FIG. 11 is a cross-sectional view of a light-emitting device of a further comparative example.

DETAILED DESCRIPTION OF THE INVENTION

Next, embodiments will be explained in detail with reference to the drawings.

Figure 1:
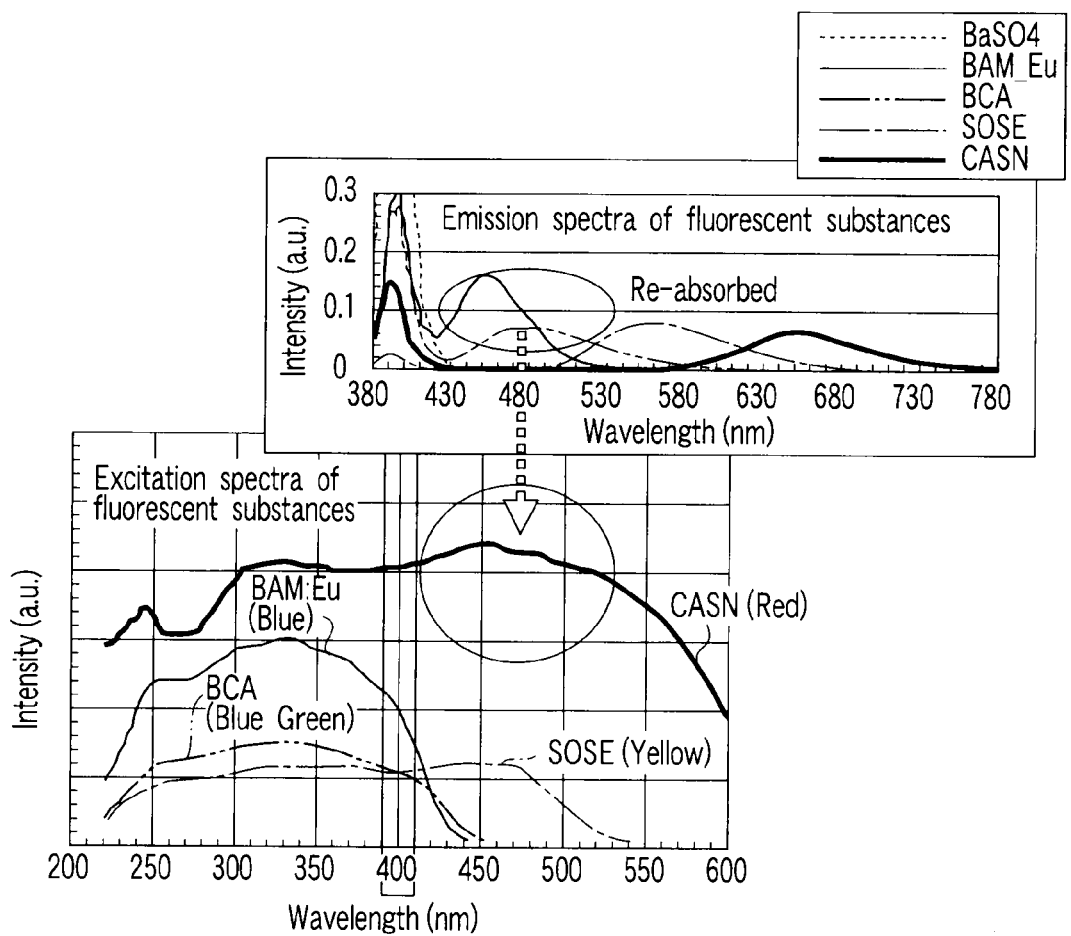
FIG. 1 is a graph showing the excitation spectrums and emission spectrums of fluorescent substances.

The present inventors have found out the following facts with respect to the excitation/emission spectrums of a plurality of fluorescent substances. These findings will be explained with reference to FIG. 1. FIG. 1 shows the excitation/emission spectrums of $CaAlSiN_3$:Eu (hereinafter referred to simply as CASN), $BaMgAl_{10}O_{17}$:Eu (hereinafter referred to simply as BAM), $(Ba, Ca, Mg)_{10}(PO_4)_6 \cdot Cl_2$:Eu (hereinafter referred to simply as BCA) and $(Sr, Ca, Ba)_2SiO_4$:Eu (hereinafter referred to simply as SOSE).

CASN absorbs the light ranging from near-ultraviolet to blue light and emitting red light. BAM or SCA absorbs an ultraviolet ray and emitting blue fluorescence. The present inventors have found out that when CASN is present in the vicinity of a fluorescent substance emitting blue light, the blue emission is absorbed by the CASN. This is a phenomenon that occurs due to the overlapping of the absorption band of one of the fluorescent substances with the fluorescent band of the other.

Therefore, when a fluorescent layer comprising a mixture consisting of plural kinds of fluorescent substances is employed in combination with an excitation light source, the aforementioned re-absorption of fluorescence generates, thereby decreasing the quantity of light to be ultimately released out of the light-emitting device. This phenomenon of re-absorption occurs without depending on the excitation light source. For example, even when an ultraviolet LED chip emitting light having a wavelength ranging from 375 to 420 nm or a blue color LED chip emitting light having a wavelength ranging from 430 to 480 nm is employed as a light source, this phenomenon of re-absorption occurs. Even if the content of fluorescent substances is increased in an attempt to obtain a white light source of high efficiency, the aforementioned re-absorption leads to only the increase of red color emission, thus resulting in the deterioration of white color luminance. This re-absorption of fluorescence would occur not only in the case of CASN but also in the case of any kind of fluorescent substance as long as it has an absorption band falling within the visible light zone.

It is considered possible to suppress the aforementioned re-absorption by arranging a plurality of fluorescent substances each differing in emitting fluorescent wavelength along the route of light to be emitted externally from an excitation element in such an order that the fluorescent substance exhibiting a longer fluorescent wavelength is arranged more close to the excitation element. Specifically, a fluorescent substance emitting a long wavelength (a wavelength closer to red color) is disposed in the vicinity of the excitation element and a layer of fluorescent substance emitting a short wavelength (a wavelength closer to blue color) is disposed at an outer position located away from the excitation element. However, it has been found out by the present inventors that when fluorescent substances are arranged in such a manner as mentioned above, not only the emission efficiency thereof would become insufficient but also the conversion efficiency would become extremely deteriorated as compared with ordinary fluorescent lamps. As a result of the extensive studies made by the present inventors in an attempt to further enhance the emission efficiency, the present invention has been accomplished wherein a specific fluorescent layer of a light-emitting device is formed so as to create a distribution in thickness.

Figure 2:
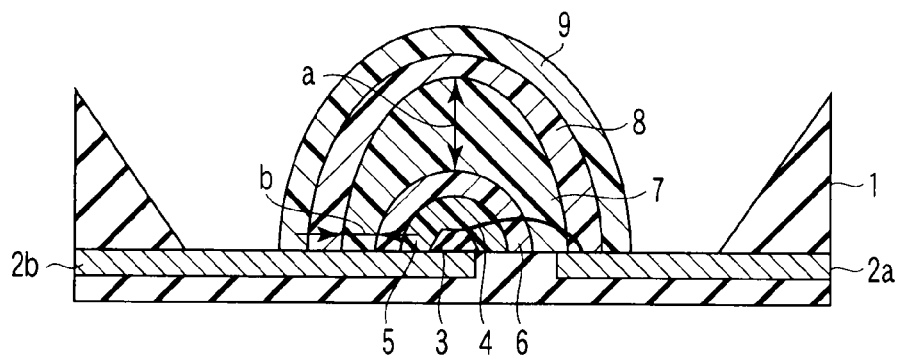
FIG. 2 is a cross-sectional view of a light-emitting device according to one embodiment.

In the light-emitting device shown in FIG. 2, a semiconductor light-emitting element 3 acting as an excitation light source is disposed at a first portion of a package portion 1 made of an inorganic or organic material and provided with a reflection film (not shown) which is made of Ag, etc. A resin layer, to be explained hereinafter, is disposed at a second portion which is formed to surround the first portion of package portion (package) 1. The p-type electrode (not shown) of the semiconductor light-emitting element 3 is electrically connected, via a wire 4, with a lead-out electrode 2a of anode side. The n-type electrode (not shown) of the semiconductor light-emitting element 3 is electrically connected, via a paste (not shown), with a lead-out electrode 2b of cathode side.

Incidentally, the lead-out electrode 2a of the anode side and the lead-out electrode 2b of the cathode side are both employed for mounting this light-emitting device on a wiring circuit board, etc.

On the semiconductor light-emitting element 3 is disposed a transparent resin layer 5 having an arch-like outer profile. The end faces of this transparent resin layer 5 are contacted with the second portion of package portion 1. As the material of this transparent resin, it is possible to employ silicone resin, for example. Further, as specific features of the arch-like curve, it may be selected from any optional curve such as semi-circular arc, parabolic curve, etc. By interposing the transparent resin layer 5 between the semiconductor light-emitting element and the fluorescent layer, it becomes possible to enhance the emission output of the light-emitting device. The fluorescent layer to be laminated on the transparent resin layer 5 can be suitably selected depending on the emission peak wavelength of the semiconductor light-emitting element 3. For example, in the case of the semiconductor light-emitting element having an emission peak at the near-ultraviolet region, a red fluorescent layer 6, a yellow fluorescent layer 7, a green fluorescent layer 8 and a blue fluorescent layer 9 are successively laminated on the transparent resin layer 5. Each of these fluorescent layers is also disposed so as to enable the end faces thereof to contact with the second portion of package portion 1.

Herein, the near-ultraviolet region means a wavelength region of 375-420 nm. Each of these fluorescent layers can be constructed by dispersing a fluorescent substance emitting a prescribed color in a binder resin. As the binder resin, it is possible to employ any kind of resin as long as the resin is substantially transparent in a region of nearly the peak wavelength of the excitation element as well as in a region of longer wavelength than that of the first mentioned region. As examples of the binder resin that can be commonly employed, they include silicone resin, epoxy resin, polydimethyl siloxane derivatives having epoxy group, oxetane resin, acrylic resin, cycloolefin resin, urea resin, fluororesin, polyimide resin, etc.

A red fluorescent layer 6 contains, for example, a CASN fluorescent substance, a yellow fluorescent layer 7 contains, for example, an SOSE fluorescent substance, a green fluorescent layer 8 contains, for example, a BCA green fluorescent substance and a blue fluorescent layer 9 contains, for example, a BAM fluorescent substance. Ordinary, the red fluorescent layer emits the light in a wavelength region of 600-780 nm, and the yellow fluorescent layer emits the light in a wavelength region of 550-590 nm. The green fluorescent layer emits the light in a wavelength region of 475-520 nm, and the blue fluorescent layer emits the light in a wavelength region of 430-475 nm.

By successively laminating the red fluorescent layer 6, the yellow fluorescent layer 7, the green fluorescent layer 8 and the blue fluorescent layer 9 as described above so as to create a laminated body, it is possible to obtain the following effects. Namely, even the light that has been emitted from each of the fluorescent substances but turned back to the interior of the device without being released out of the device can be reflected by an interface between the neighboring fluorescent layers. As a result, the probability of light being emitted from the device can be increased, thus making it possible to expect further enhanced emission efficiency.

As already explained above, in the case of a mixed fluorescent layer containing a blue fluorescent substance, a green fluorescent substance and a red fluorescent substance, the fluorescence from the blue fluorescent substance and the fluorescence from the green fluorescent substance are absorbed by the red fluorescent substance. Even if the fluorescent substances are respectively included in each of the layers, the fluorescence from the blue fluorescent layer and from the green fluorescent layer is re-absorbed by the red fluorescent layer if the red fluorescent layer is disposed on the outer side of the blue fluorescent layer and the green fluorescent layer. According to this embodiment, this phenomenon can be obviated.

The red fluorescent layer 6, the yellow fluorescent layer 7, the green fluorescent layer 8 and the blue fluorescent layer 9 are all provided with end faces contacting with the second portion of the package portion 1. Including the transparent resin layer 5 to be disposed on the inner side of the red fluorescent layer 6, the fluorescent layers are generally formed so as to have a uniform thickness. Whereas, in the case of the light-emitting device shown in the drawing, the thickness of the yellow fluorescent layer 7 is not uniform, but made non-uniform in such a manner that the thickness "a" at the center portion thereof is made larger than the thickness "b" at the end faces thereof.

The present inventors have taken notice of the directivity of semiconductor light-emitting element employed as an excitation light source and found out the fact that the light distribution of an LED is higher in the center portion. When the yellow fluorescent layer to be interposed between the red fluorescent layer and the green fluorescent layer is formed so as to make the thickness of center portion larger than the other portions, the emission potential of the light source can be effectively utilized. This phenomenon can be explained as follows. Namely, in addition to the enhancement of efficiency of yellow emission, the re-absorption of green light emission and blue light emission can be suppressed, thereby making it possible to effectively take up the green emission and the blue emission. These findings were first discovered by the present inventors.

In this embodiment, the green fluorescent layer 8 is disposed on the outer side of the red fluorescent layer 6, the blue fluorescent layer 9 is disposed on the outer side of the green fluorescent layer 8. Further, the yellow fluorescent layer 7 is interposed between the red fluorescent layer 6 and the green fluorescent layer 8. By arranging these fluorescent layers in this manner, it is possible to suppress the re-absorption of fluorescence and, at the same time, to realize a high emission efficiency. Moreover, the yellow fluorescent layer 7 is formed such that the thickness "a" at the center portion thereof is made larger than the thickness "b" at the end faces thereof. Due to the provision of such a thickness distribution, it is now possible to effectively suppress the re-absorption of fluorescence.

Although the effect of suppressing the re-absorption of fluorescence can be derived by simply enlarging the thickness "a" at the center portion of the yellow fluorescent layer relative to the thickness "b" at the end faces thereof, a more sufficient effect can be derived by setting the ratio of thickness (a/b) to not less than 1.5. However, since the structure where the thickness "a" at the center portion of the yellow fluorescent layer is too large is difficult to manufacture, the upper limit of the ratio of thickness (a/b) should preferably be confined to 4 or so.

The light-emitting device of this embodiment can be manufactured by any optional method where fluorescent substances each differing in emitting fluorescent wavelength can be laminated in such an order that the fluorescent substance exhibiting a longer fluorescent wavelength comes more close to the excitation light source. For example, it is possible to employ a method using a fluorescent substance-containing resin. This fluorescent substance-containing resin can be manufactured by dispersing a specific color fluorescent substance in a binder resin and this procedure is repeated for each of different fluorescent substances.

The fluorescent substance-containing resin thus prepared is then coated by a dispenser while controlling the thickness of the fluorescent layer and dried to obtain a fluorescent layer. This procedure is repeated for each of the fluorescent layers. The fluorescent substance-containing resin may be coated by vacuum printing. As described above, the fluorescent substance-dispersed resins are respectively prepared and respectively coated, dried and cured while controlling the thickness of layer. This procedure is repeated for the preparation of each of the fluorescent layers. By the aforementioned procedure, a light-emitting device as shown in FIG. 2 can be manufactured.

When a plurality of fluorescent substances which may bring about the re-absorption are present, the fluorescent substances are laminated in such an order that one exhibiting a longer fluorescent wavelength comes more close to the excitation light source and a layer having the same thickness distribution as described above is introduced between a fluorescent layer which is capable of re-absorbing fluorescence and a fluorescent layer which is liable to the re-absorption.

Figure 3:
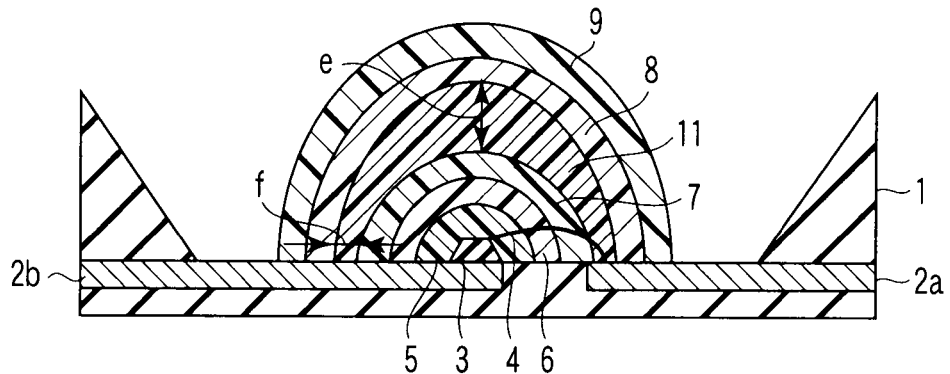
FIG. 3 is a cross-sectional view of a light-emitting device according to another embodiment.

Alternatively, the aforementioned effects can be obtained without providing the yellow fluorescent layer with the aforementioned thickness distribution. Specifically, a second transparent resin layer 11 is interposed between the yellow fluorescent layer 7 and the green fluorescent layer 8 and, at the same time, the second transparent resin layer 11 is formed in such a manner that the thickness "e" at the center portion thereof is made larger than the thickness "f" at the end faces thereof as shown in FIG. 3. In the case of the light-emitting device shown in FIG. 3, the laminated body is constituted by the red fluorescent layer 6, the yellow fluorescent layer 7, the second transparent resin layer 11, the green fluorescent layer 8 and the blue fluorescent layer 9. The second transparent resin layer 11 interposed between the yellow fluorescent layer 7 and the green fluorescent layer 8 acts to suppress the blue light emission and green light emission from being re-absorbed by the red fluorescent substance such as CASN. Since the second transparent resin layer 11 is formed to have a thickness distribution where the thickness at the center portion thereof is made larger than the thickness at the end faces thereof, it is now possible to effectively suppress the re-absorption of fluorescence and to achieve a high emission efficiency.

Next, one embodiment where a blue LED chip is employed as a semiconductor light-emitting element 3 functioning as an excitation light source will be explained with reference to FIG. 4. The light of blue color region 430-480 nm in wavelength is emitted in general. In the light-emitting device shown in FIG. 4, a transparent resin layer 5 having an arch-like outer profile is disposed on the semiconductor light-emitting element 3. On this transparent resin layer 5, there are successively laminated the red fluorescent layer 6, the yellow fluorescent layer 7 and the green fluorescent layer 8. Since the yellow fluorescent layer 7 is formed to have a thickness distribution where the thickness "i" at the center portion thereof is made larger than the thickness "j" at the end faces thereof, it is now possible to effectively suppress the re-absorption of fluorescence and to achieve a high emission efficiency.

Figure 5:
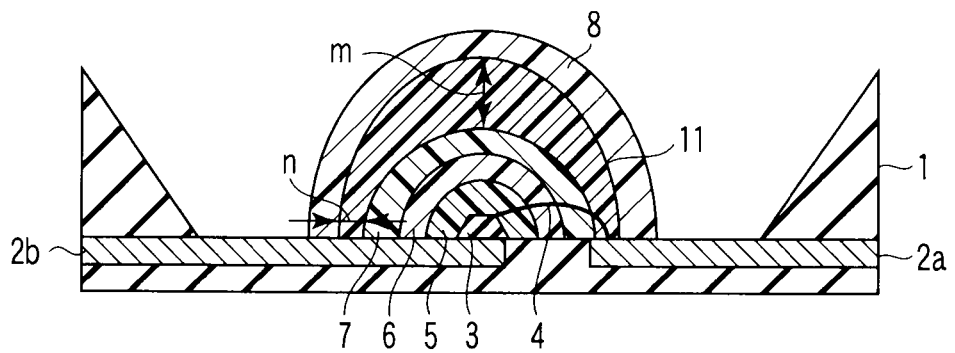
FIG. 5 is a cross-sectional view of a light-emitting device according to a further embodiment.

Alternatively, a second transparent resin layer 11 may be interposed between the yellow fluorescent layer 7 and the green fluorescent layer 8 without providing the yellow fluorescent layer 7 with the aforementioned thickness distribution as shown in FIG. 5. This second transparent resin layer 11 is formed in such a manner that the thickness "m" at the center portion thereof is made larger than the thickness "n" at the end faces thereof. As described above, the second transparent resin layer 11 interposed between the yellow fluorescent layer 7 and the green fluorescent layer 8 acts to suppress the green light emission from being re-absorbed by the red fluorescent substance such as CASN. Since the second transparent resin layer 11 is formed to have a thickness distribution where the thickness at the center portion thereof is made larger than the thickness at the end faces thereof, it is now possible to effectively suppress the re-absorption of fluorescence and to achieve a high emission efficiency.

Next, examples will be explained.

Example 1

In this example, a light-emitting device constructed as shown in FIG. 2 was manufactured.

An ultraviolet LED chip exhibiting an emission peak at a wavelength ranging from 400 to 405 nm and having an InGaN-based compound semiconductor as an active layer and suitable p/n electrodes was prepared as a semiconductor light-emitting element 3. This semiconductor light-emitting element 3 was then secured to a package portion 1 by an Au—Sn paste. This package portion 1 was provided with lead-out electrodes 2a and 2b and with an aluminum nitride-based substrate having a wiring portion surrounded by a high reflectance material. The lead-out electrode 2a of the anode side was electrically connected with the p-type electrode of the ultraviolet LED chip by an Au wire 4. The lead-out electrode 2b of the cathode side was electrically connected with the n-type electrode of the ultraviolet LED chip by Au—Sn paste.

Using a silicone-based transparent resin, a transparent resin layer 5 was formed on the semiconductor light-emitting element 3. Specifically, first of all, while heating a substrate at a temperature of 150° C. in an air atmosphere and at atmospheric pressure and using a dispenser, a silicone-based transparent resin was coated on the substrate so as to form a layer of an arch-like configuration where a ratio between the thickness of the center portion thereof and the thickness of each of end face portions was approximately 1:1. Thereafter, the resultant body was allowed to dry at atmospheric pressure at a temperature of 150° C. for 10 to 90 minutes to obtain a transparent resin layer 5.

A CASN red fluorescent substance was dispersed in silicone resin employed as a binder resin to prepare a red fluorescent substance-dispersed resin. The red fluorescent substance employed herein was found to exhibit an emission peak at a wavelength of 655 nm. While heating the substrate at a temperature of 150° C. in an air atmosphere and at atmospheric pressure and using a dispenser, the red fluorescent substance-dispersed resin was coated so as to entirely cover the transparent resin layer 5 and to form a layer of an arch-like configuration having a uniform thickness. Thereafter, the resultant body was allowed to dry at atmospheric pressure at a temperature of 150° C. for 10 to 90 minutes to obtain a red fluorescent layer 6. In this red fluorescent layer 6, a ratio between the thickness of the center portion thereof and the thickness of each of end face portions was approximately 1:1.

An SOSE yellow fluorescent substance was dispersed in silicone resin to prepare a yellow fluorescent substance-dispersed resin. The yellow fluorescent substance employed herein was found to exhibit an emission peak at a wavelength of 555 nm. While heating the substrate at a temperature of 150° C. in an air atmosphere and at atmospheric pressure, the yellow fluorescent substance-dispersed resin was coated on the red fluorescent layer 6 so as to form a layer of an arch-like configuration where the thickness "a" of the center portion thereof was made larger than the thickness "b" of each of end faces (i.e. a/b=2). Thereafter, the resultant body was allowed to dry at atmospheric pressure at a temperature of 150° C. for 10 to 90 minutes to obtain a yellow fluorescent layer 7.

A BCA green fluorescent substance exhibiting an emission peak at a wavelength of 480 nm was dispersed in silicone resin to prepare a green fluorescent substance-dispersed resin. A BAM blue fluorescent substance exhibiting an emission peak at a wavelength of 450 nm was dispersed in silicone resin to prepare a blue fluorescent substance-dispersed resin. While heating the substrate at a temperature of 150° C. and using a dispenser, the green fluorescent substance-dispersed resin and the blue fluorescent substance-dispersed resin were successively coated on the yellow fluorescent layer 7 so as to entirely cover the underlying fluorescent layer and to form layers each having an arch-like configuration having a uniform thickness.

Thereafter, the resultant body was allowed to dry at atmospheric pressure at a temperature of 150° C. for 10 to 90 minutes to cure all of these fluorescent layers to obtain a light-emitting device having a construction as shown in FIG. 2. In these green fluorescent layer 8 and blue fluorescent layer 9, a ratio between the thickness of the center portion thereof and the thickness of each of end face portions was approximately 1:1.

Comparative Example 1

The same kinds of CASN red fluorescent substance, SOSE yellow fluorescent substance, BCA green fluorescent substance and BAM blue fluorescent substance as employed in Example 1 were prepared. Then, all of these four kinds of fluorescent substances were mixed with and dispersed in silicone resin to prepare a mixed fluorescent substance-dispersed resin.

Figure 6:
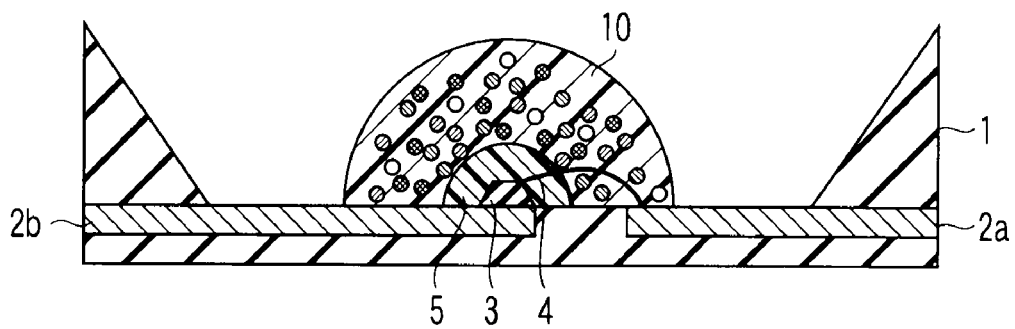
FIG. 6 is a cross-sectional view of a light-emitting device of one comparative example.

A light-emitting device having a construction as shown in FIG. 6 was prepared in the same manner as described above except that the mixed fluorescent substance-dispersed resin was coated on the transparent resin layer 5 to form a mixed fluorescent layer 10 having an arch-like configuration. Incidentally, in this mixed fluorescent layer 10, a ratio between the thickness of the center portion thereof and the thickness of each of end face portions was approximately 1:1.

Comparative Example 2

Figure 7:
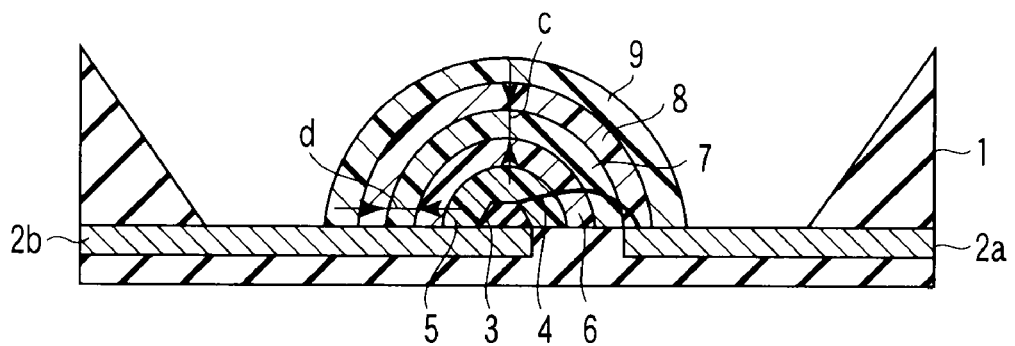
FIG. 7 is a cross-sectional view of a light-emitting device of another comparative example.

The procedures described in Example 1 were repeated in the same manner except that the yellow fluorescent layer 7 was coated uniformly so that the ratio between the thickness "c" of the center portion thereof and the thickness "d" of each of end face portions thereof became 1:1 (i.e. c/d=1), thereby manufacturing a light-emitting device having a construction as shown in FIG. 7.

The light-emitting devices of Example 1, Comparative Example 1 and Comparative Example 2 were investigated with respect to the chromaticity coordinates of luminescent color. As a result, the chromaticity coordinates were (0.34, 0.37) in the case of Example 1, (0.36, 0.36) in the case of Comparative Example 1, and (0.38, 0.38) in the case of Comparative Example 2. Namely, the emission of white light was recognized in all of these examples.

However, with respect to the total luminous flux and emission efficiency, while Example 1 indicated 57 (lm/W) and Ra (color rendering)=82; Comparative Example 1 indicated 19 (lm/W) and Ra=88. In Comparative Example 2, they were 51 (lm/W) and Ra=88.

The light-emitting device of Example 1 was found more improved in emission efficiency as compared with the light-emitting device of Comparative Examples. This improvement of emission efficiency can be attributed to the provision of a specific distribution of thickness in the yellow fluorescent layer 7 as explained below. In the case of this example, the emission intensity distribution (light distribution) of the LED chip employed as a semiconductor light-emitting element was not uniform in all of the directions but was made higher in the direction toward the center portion thereof and lower in the direction toward the end faces thereof. Therefore, although the emission intensities of the blue fluorescent substance and the red fluorescent substance can be made higher in the direction toward the center portion thereof, the quantity of the light from these fluorescent substances that will be re-absorbed by the CASN employed as a red fluorescent substance will be increased. For this reason, the luminescent color to be obtained would become highly reddish white, thus generating color shift.

If it is possible to suppress the re-absorption of blue light emission and green light emission at the center portion of LED chip, the generation of color shift can be prevented. According to the embodiment, this problem has been overcome by providing a structure wherein the yellow fluorescent layer 7, which is scarcely capable of re-absorbing blue light emission and green light emission, is interposed between the red fluorescent layer 6 and the green fluorescent layer 8 and, at the same time, the thickness in the direction toward the center portion of yellow fluorescent layer 7 is enlarged. When the center portion of the yellow fluorescent layer 7 is made larger in thickness, the blue light emission and green light emission moving toward the inner circumferential portion can be increasingly scattered and absorbed by the yellow fluorescent substance and the resin.

As a result, the re-absorption of the light emitted from the blue fluorescent substance and green fluorescent substance by the red fluorescent substance can be suppressed, thus making it possible to obtain blue light emission and green light emission without deteriorating the emission efficiency thereof. When the center portion of the yellow fluorescent layer 7 is made larger in thickness, it is also possible to enhance the intensity of yellow light emission which is high in visibility, thus making it possible to obtain a white LED which is free from color shift.

As described above, due to the provision of a thickness distribution in the yellow fluorescent layer 7, it becomes possible to absorb the exciting light without losing the exciting light, thus making it possible to obtain a white light source which is high in emission efficiency and almost free from discoloration.

Incidentally, the emission intensity distribution of a semiconductor laser (LD) light source is much higher in the direction toward the top portion thereof than that of the LED. Therefore, even when the LD is employed as a semiconductor light-emitting element, it is possible to obtain almost the same effects as described above by enlarging the thickness of the center portion of the yellow fluorescent layer 7.

On the other hand, when the thickness of the center portion of the yellow fluorescent layer 7 is not made larger than the end faces, it would be impossible to obtain the aforementioned effects. For example, when the thickness of the top portion of yellow fluorescent layer 7 is as thin as the thickness of each of the end faces thereof, the re-absorption by the red fluorescent substance may be increased, thus making the luminescent color become strongly reddish white. Even if the thickness of the center portion of yellow fluorescent layer 7 is increased, when the thickness of each of the end faces thereof is increased likewise, it would be impossible to enable the light emission from the light source to reach the green fluorescent layer 8 and the blue fluorescent layer 9 which are located at an outer circumferential portion. Since it is impossible in this case to obtain sufficient green light emission as well as sufficient blue light emission, the luminescent color would become also strongly reddish white as described above.

Example 2

In this example, a light-emitting device constructed as shown in FIG. 3 was manufactured. By repeating the same procedures as described in Example 1, a transparent resin layer 5 and a red fluorescent layer 6 were formed on the same kind of semiconductor light-emitting element 3 as employed in Example 1.

An SOSE yellow fluorescent substance exhibiting an emission peak at a wavelength of 552 nm was dispersed in silicone resin to prepare a yellow fluorescent substance-dispersed resin. This yellow fluorescent substance-dispersed resin was laminated so as to entirely cover the red fluorescent layer 6 and to form a layer of an arch-like configuration having a uniform thickness, thereby forming a yellow fluorescent layer 7. Then, a second transparent resin layer 11 was formed on the yellow fluorescent layer 7 in such a manner that the thickness "e" of the center portion thereof was made larger than the thickness "f" of each of end faces thereof (i.e. e/f=2).

Further, a silicone resin layer containing a BCA green fluorescent substance exhibiting an emission peak at 480 nm and a silicone resin layer containing a BAM blue fluorescent substance exhibiting an emission peak at 450 nm were successively laminated so as to cover the second transparent resin layer 11, each layer having an arch-like configuration having a uniform thickness, thereby forming a green fluorescent layer 8 and a blue fluorescent layer 9, respectively, thus obtaining the light-emitting device constructed as shown in FIG. 3.

Comparative Example 3

Figure 8:
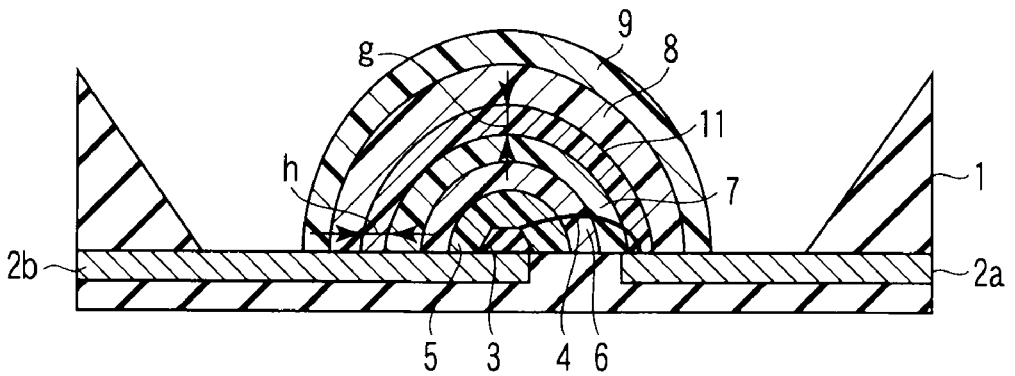
FIG. 8 is a cross-sectional view of a light-emitting device of a further comparative example.

The procedures described in Example 2 were repeated in the same manner except that the second transparent resin layer 11 was coated uniformly so as to create a thickness distribution wherein the ratio between the thickness "g" of the center portion thereof and the thickness "h" of each of end face portions thereof became g/h=1, thereby manufacturing a light-emitting device having a construction as shown in FIG. 8.

The light-emitting devices of Example 2 and Comparative Example 3 were investigated with respect to the chromaticity coordinates of luminescent color. As a result, the chromaticity coordinates were (0.35, 0.38) and Ra=87 in the case of Example 2, and (0.38, 0.38) and Ra=88 in the case of Comparative Example 3. Namely, the emission of white light was recognized in all of these examples.

However, with respect to the emission efficiency, while Example 2 indicated 53 (lm/W), Comparative Example 3 indicated 51 (lm/W).

The light-emitting device of Example 2 was found more improved in emission efficiency as compared with the light-emitting device of Comparative Example 3. This improvement of emission efficiency can be attributed to the provision of a specific distribution of thickness in the second transparent resin layer 11 as explained below. Namely, the transparent resin layer 11 was featured to have a transmittance of about 90% and to contain voids. By increasing the thickness of this transparent resin layer 11, the light emitted toward the inner circumferential portions of the blue fluorescent layer 9 and the green fluorescent layer 8, both located at an outer circumferential portion, can be increasingly scattered and absorbed.

Namely, the probability of the blue light emission and the green light emission reaching the red fluorescent layer 6 containing CASN would be decreased. As a result, the blue light emission as well as the green light emission can be prevented from being re-absorbed by the CASN employed as a red fluorescent substance.

In the same manner as in the case of the yellow fluorescent layer 7, by enlarging the thickness of the center portion of the second transparent resin layer 11 and decreasing the thickness of each of end faces thereof, it becomes possible, in the case of the second transparent resin layer 11 also, to secure the blue emission and the green emission without deteriorating the emission efficiency. As described above, due to the provision of thickness distribution in the second transparent resin layer 11, it becomes possible to absorb the exciting light without losing the exciting light, thus making it possible to obtain a white light source which is high in emission efficiency and almost free from discoloration.

Example 3

Figure 4:
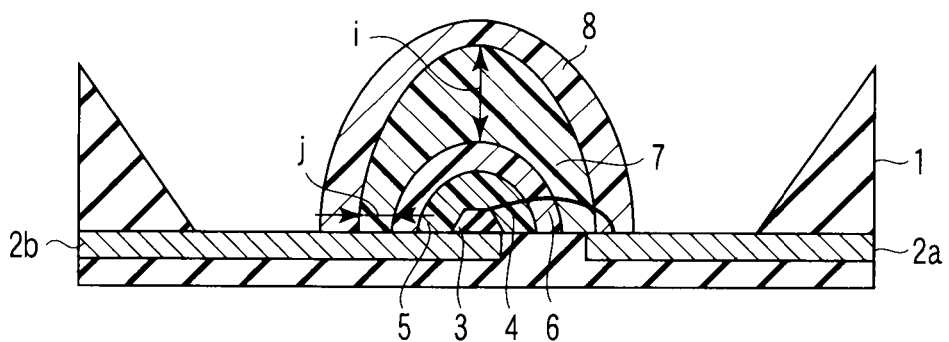
FIG. 4 is a cross-sectional view of a light-emitting device according to a further embodiment.

In this example, a light-emitting device constructed as shown in FIG. 4 was manufactured.

A blue LED chip exhibiting an emission peak at a wavelength ranging from 450 to 470 nm and having an InGaN-based compound semiconductor as an active layer and suitable p/n electrodes was prepared as a semiconductor light-emitting element 3. This semiconductor light-emitting element 3 was then secured to a package portion 1 by an Au—Sn paste. This package portion 1 was provided with lead-out electrodes 2a and 2b and with an aluminum nitride-based substrate having a wiring portion surrounded by a high reflectance material. The lead-out electrode 2a of the anode side was electrically connected with the p-type electrode of the blue LED chip by an Au wire 4. The lead-out electrode 2b of the cathode side was electrically connected with the n-type electrode of the blue LED chip by Au—Sn paste.

Using a silicone-based transparent resin, a transparent resin layer 5 was formed on the semiconductor light-emitting element 3. Specifically, first of all, while heating a substrate at a temperature of 150° C. in an air atmosphere and at atmospheric pressure and using a dispenser, a silicone-based transparent resin was coated on the substrate so as to form a layer of an arch-like configuration where a ratio between the thickness of the center portion thereof and the thickness of each of end face portions was approximately 1:1. Thereafter, the resultant body was allowed to dry at atmospheric pressure at a temperature of 150° C. for 10 to 90 minutes to obtain a transparent resin layer 5.

A CASN red fluorescent substance was dispersed in silicone resin employed as a binder resin to prepare a red fluorescent substance-dispersed resin. The red fluorescent substance employed herein was found to exhibit an emission peak at a wavelength of 655 nm. While heating the substrate at a temperature of 150° C. in an air atmosphere and at atmospheric pressure and using a dispenser, the red fluorescent substance-dispersed resin was coated so as to entirely cover the transparent resin layer 5 and to form a layer of an arch-like configuration having a uniform thickness. Thereafter, the resultant body was allowed to dry at atmospheric pressure at a temperature of 150° C. for 10 to 90 minutes to obtain a red fluorescent layer 6. In this red fluorescent layer 6, a ratio between the thickness of the center portion thereof and the thickness of each of end face portions was approximately 1:1.

An SOSE yellow fluorescent substance exhibiting an emission peak at a wavelength of 555 nm was dispersed in silicone resin to prepare a yellow fluorescent substance-dispersed resin. While heating the substrate at a temperature of 150° C. in an air atmosphere and at atmospheric pressure, the yellow fluorescent substance-dispersed resin was coated on the red fluorescent layer 6 so as to form a layer of an arch-like configuration where the thickness "i" of the center portion thereof was made larger than the thickness "j" of each of end faces (i.e. i/j=1.5). Thereafter, the resultant body was allowed to dry at atmospheric pressure at a temperature of 150° C. for 10 to 90 minutes to obtain a yellow fluorescent layer 7.

A BCA green fluorescent substance exhibiting an emission peak at a wavelength of 480 nm was dispersed in silicone resin to prepare a green fluorescent substance-dispersed resin. While heating the substrate at a temperature of 150° C. and using a dispenser, the green fluorescent substance-dispersed resin was coated on the yellow fluorescent layer 7 so as to entirely cover the underlying fluorescent layer and to form a layer having an arch-like configuration having a uniform thickness.

Thereafter, the resultant body was allowed to dry at atmospheric pressure at a temperature of 150° C. for 10 to 90 minutes to cure all of these fluorescent layers to obtain a light-emitting device having a construction as shown in FIG. 4. In this green fluorescent layer 8, a ratio between the thickness of the center portion thereof and the thickness of each of end face portions was approximately 1:1.

Comparative Example 4

The same kinds of CASN red fluorescent substance, SOSE yellow fluorescent substance and BCA green fluorescent substance as employed in Example 3 were prepared. Then, all of these three kinds of fluorescent substances were mixed with and dispersed in silicone resin to prepare a mixed fluorescent substance-dispersed resin.

A light-emitting device having a construction as shown in FIG. 9 was prepared in the same manner as described above except that the mixed fluorescent substance-dispersed resin was coated on the transparent resin layer 5 to form a mixed fluorescent layer 10 having an arch-like configuration. Incidentally, in this mixed fluorescent layer 10, a ratio between the thickness of the center portion thereof and the thickness of each of end face portions was approximately 1:1.

Comparative Example 5

The procedures described in Example 3 were repeated in the same manner except that the yellow fluorescent layer 7 was coated uniformly so that the ratio between the thickness "k" of the center portion thereof and the thickness "l" of each of end face portions thereof became 1:1 (i.e. k/l=1), thereby manufacturing a light-emitting device having a construction as shown in FIG. 10.

The light-emitting devices of Example 3, Comparative Example 4 and Comparative Example 5 were investigated with respect to the chromaticity coordinates of luminescent color. As a result, the chromaticity coordinates were (0.33, 0.34) and Ra=86 in the case of Example 3, (0.35, 0.36) and Ra=87 in the case of Comparative Example 4, and (0.38, 0.38) and Ra=78 in the case of Comparative Example 5. Namely, the emission of white light was recognized in all of these examples.

However, with respect to the total luminous flux and emission efficiency, while Example 4 indicated 65 (lm/W), Comparative Example 5 indicated 20 (lm/W) and Comparative Example 5 indicated 58 (lm/W).

The light-emitting device of Example 3 was found more improved in emission efficiency as compared with the light-emitting device of Comparative Examples. For the same reasons as explained in the aforementioned Example 1, due to the provision of thickness distribution in the yellow fluorescent layer 7, it becomes possible to absorb the exciting light without losing the exciting light, thus making it possible to obtain a white light source which is high in emission efficiency and almost free from discoloration.

Example 4

In this example, a light-emitting device constructed as shown in FIG. 5 was manufactured. By repeating the same procedures as described in Example 3, a transparent resin layer 5 and a red fluorescent layer 6 were formed on the same kind of semiconductor light-emitting element 3 as employed in Example 3.

An SOSE yellow fluorescent substance exhibiting an emission peak at a wavelength of 555 nm was dispersed in silicone resin to prepare a yellow fluorescent substance-dispersed resin. This yellow fluorescent substance-dispersed resin was laminated so as to entirely cover the red fluorescent layer 6 and to form a layer of an arch-like configuration having a uniform thickness, thereby forming a yellow fluorescent layer 7. Then, a second transparent resin layer 11 was formed on the yellow fluorescent layer 7 in such a manner that the thickness "m" of the center portion thereof was made larger than the thickness "n" of each of end faces thereof (i.e. m/n=2).

Further, a silicone resin layer containing a BCA green fluorescent substance exhibiting an emission peak at 480 nm was formed so as to cover the second transparent resin layer 11 and to have an arch-like configuration having a uniform thickness, thereby forming a green fluorescent layer 8 and obtaining the light-emitting device constructed as shown in FIG. 5.

Comparative Example 6

The procedures described in Example 4 were repeated in the same manner except that the second transparent resin layer 11 was coated uniformly so as to create a thickness distribution wherein the ratio between the thickness "o" of the center portion thereof and the thickness "p" of each of end face portions thereof became o/p=1, thereby manufacturing a light-emitting device having a construction as shown in FIG. 11.

The light-emitting devices of Example 4 and Comparative Example 6 were investigated with respect to the chromaticity coordinates of luminescent color. As a result, the chromaticity coordinates were (0.35, 0.38) and Ra=82 in the case of Example 4, and (0.38, 0.38) and Ra=78 in the case of Comparative Example 6. Namely, the emission of white light was recognized in all of these examples.

However, with respect to the emission efficiency, while Example 4 indicated 65 (lm/W), Comparative Example 6 indicated 61 (lm/W).

The light-emitting device of Example 4 was found more improved in emission efficiency as compared with the light-emitting device of Comparative Example 6. For the same reasons as explained in the aforementioned Example 2, due to the provision of thickness distribution in the second transparent resin layer 11, it becomes possible to absorb the exciting light without losing the exciting light, thus making it possible to obtain a white light source which is high in emission efficiency and almost free from discoloration.

Example 5

In this example, a light-emitting device constructed as shown in FIG. 2 was manufactured.

A near-ultraviolet semiconductor light-emitting element exhibiting an emission peak at a wavelength ranging from 400 to 410 nm and having suitable p/n electrodes was prepared as a semiconductor light-emitting element 3, wherein the light-emitting element was provided with a GaN-based vertical resonator, with a reflecting mirror constituted by an $SiO_2/ZrO_2$ dielectric multi-layer film, and with a light-emitting layer constituted by an AlGaN/GaN multiple quantum well active layer. This semiconductor light-emitting element 3 was then secured to the AlN substrate of package portion 1 using Au—Sn paste. The lead-out electrode 2a of the anode side was electrically connected with the p-type electrode of the LED chip by an Au wire 4. The lead-out electrode 2b of the cathode side was electrically connected with the n-type electrode of the LED chip by Au—Sn paste.

Using a silicone-based transparent resin, a transparent resin layer 5 was formed on the semiconductor light-emitting element 3. Specifically, first of all, while heating a substrate at a temperature of 150° C. in an air atmosphere and at atmospheric pressure and using a dispenser, a silicone-based transparent resin was coated on the substrate so as to form a layer of an arch-like configuration where a ratio between the thickness of the center portion thereof and the thickness of each of end face portions was approximately 1:1. Thereafter, the resultant body was allowed to dry at atmospheric pressure at a temperature of 150° C. for 10 to 90 minutes to obtain a transparent resin layer 5.

A CASN red fluorescent substance exhibiting an emission peak at a wavelength of 655 nm was dispersed in silicone resin employed as a binder resin to prepare a red fluorescent substance-dispersed resin. While heating the substrate at a temperature of 150° C. in an air atmosphere and at atmospheric pressure and using a dispenser, the red fluorescent substance-dispersed resin was coated so as to entirely cover the transparent resin layer 5 and to form a layer of an arch-like configuration having a uniform thickness. Thereafter, the resultant body was allowed to dry at atmospheric pressure at a temperature of 150° C. for 10 to 90 minutes to obtain a red fluorescent layer 6. In this red fluorescent layer 6, a ratio between the thickness of the center portion thereof and the thickness of each of end face portions was approximately 1:1.

An SOSE yellow fluorescent substance exhibiting an emission peak at a wavelength of 555 nm was dispersed in silicone transparent resin to prepare a yellow fluorescent substance-dispersed resin. While heating the substrate at a temperature of 150° C. in an air atmosphere and at atmospheric pressure, the yellow fluorescent substance-dispersed resin was coated on the red fluorescent layer 6 so as to form a layer of an arch-like configuration where the thickness "a" of the top portion thereof was made larger than the thickness "b" of each of end faces (i.e. a/b=2). Thereafter, the resultant body was allowed to dry at atmospheric pressure at a temperature of 150° C. for 10 to 90 minutes to obtain a yellow fluorescent layer 7.

A BCA green fluorescent substance exhibiting an emission peak at a wavelength of 480 nm was dispersed in silicone resin to prepare a green fluorescent substance-dispersed resin. A BAM blue fluorescent substance exhibiting an emission peak at a wavelength of 450 nm was dispersed in silicone resin to prepare a blue fluorescent substance-dispersed resin. While heating the substrate at a temperature of 150° C. and using a dispenser, the green fluorescent substance-dispersed resin and the blue fluorescent substance-dispersed resin were successively coated on the yellow fluorescent layer 7 so as to entirely cover the underlying fluorescent layer and to form a layer having an arch-like configuration having a uniform thickness.

Thereafter, the resultant body was allowed to dry at atmospheric pressure at a temperature of 150° C. for 10 to 90 minutes to cure all of these fluorescent layers to obtain a light-emitting device having a construction as shown in FIG. 2. In these green fluorescent layer 8 and blue fluorescent layer 9, a ratio between the thickness of the center portion thereof and the thickness of each of end face portions was approximately 1:1.

Comparative Example 7

The same kinds of CASN red fluorescent substance, SOSE yellow fluorescent substance, BCA green fluorescent substance and BAM blue fluorescent substance as employed in Example 5 were prepared. Then, all of these four kinds of fluorescent substances were mixed with and dispersed in silicone resin to prepare a mixed fluorescent substance-dispersed resin.

A light-emitting device having a construction as shown in FIG. 6 was prepared in the same manner as described above except that the mixed fluorescent substance-dispersed resin was coated on the transparent resin layer 5 to form a mixed fluorescent layer 10 having an arch-like configuration. Incidentally, in this mixed fluorescent layer 10, a ratio between the thickness of the center portion thereof and the thickness of each of end face portions was approximately 1:1.

Comparative Example 8

The procedures described in Example 5 were repeated in the same manner except that the yellow fluorescent layer 7 was coated uniformly so that the ratio between the thickness "c" of the center portion thereof and the thickness "d" of each of end face portions thereof became 1:1 (i.e. c/d=1), thereby manufacturing a light-emitting device having a construction as shown in FIG. 7.

The light-emitting devices of Example 5, Comparative Example 7 and Comparative Example 8 were investigated with respect to the chromaticity coordinates of luminescent color. As a result, the chromaticity coordinates were (0.34, 0.37) in the case of Example 5, (0.36, 0.36) in the case of Comparative Example 7, and (0.38, 0.38) in the case of Comparative Example 8.

However, with respect to the total luminous flux and emission efficiency, while Example 5 indicated 28.5 (lm/W) and Ra (color rendering)=82; Comparative Example 7 indicated 9.5 (lm/W) and Ra=88. In Comparative Example 8, they were 25.5 (lm/W) and Ra=88.

The light-emitting device of Example 4 was found more improved in emission efficiency as compared with the light-emitting device of Comparative Examples. In the case of the light-emitting element chip employed in Example 4, the light distribution characteristics thereof were designed such that they were made higher in the vertical direction and made lower in the lateral direction. Therefore, for the same reasons as explained in the above-described Example 1, due to the provision of thickness distribution in the yellow fluorescent layer 7, it becomes possible to absorb the exciting light without losing the exciting light, thus making it possible to obtain a white light source which is high in emission efficiency and almost free from discoloration.

Example 6

In this example, a light-emitting device constructed as shown in FIG. 3 was manufactured.

By repeating the same procedures as described in Example 5, a transparent resin layer 5 and a red fluorescent layer 6 were formed on the same kind of semiconductor light-emitting element 3 as employed in Example 5.

An SOSE yellow fluorescent substance exhibiting an emission peak at a wavelength of 552 nm was dispersed in silicone resin to prepare a yellow fluorescent substance-dispersed resin. This yellow fluorescent substance-dispersed resin was laminated so as to entirely cover the red fluorescent layer 6 and to form a layer of an arch-like configuration having a uniform thickness, thereby forming a yellow fluorescent layer 7. Then, a second transparent resin layer 11 was formed on the yellow fluorescent layer 7 in such a manner that the thickness "e" of the center portion thereof was made larger than the thickness "f" of each of end faces thereof (i.e. e/f=2).

Further, a silicone resin layer containing a BCA green fluorescent substance exhibiting an emission peak at 480 nm and a silicone resin layer containing a BAM blue fluorescent substance exhibiting an emission peak at 450 nm were successively laminated so as to cover the second transparent resin layer 11, each layer having an arch-like configuration having a uniform thickness, thereby forming a green fluorescent layer 8 and a blue fluorescent layer 9, respectively, thus obtaining the light-emitting device constructed as shown in FIG. 3.

Comparative Example 9

The procedures described in Example 6 were repeated in the same manner except that the second transparent resin layer 11 was coated uniformly so as to create a thickness distribution wherein the ratio between the thickness "g" of the center portion thereof and the thickness "h" of each of end face portions thereof became g/h=1, thereby manufacturing a light-emitting device having a construction as shown in FIG. 8.

The light-emitting devices of Example 6 and Comparative Example 9 were investigated with respect to the chromaticity coordinates of luminescent color. As a result, the chromaticity coordinates were (0.35, 0.38) and Ra=87 in the case of Example 6, and (0.38, 0.38) and Ra=88 in the case of Comparative Example 9. Namely, the emission of white light was recognized in all of these examples.

However, with respect to the emission efficiency, while Example 6 indicated 27 (lm/W), Comparative Example 9 indicated 25 (1 m/W).

The light-emitting device of Example 6 was found more improved in emission efficiency as compared with the light-emitting device of Comparative Example 9. For the same reasons as explained in the aforementioned Example 2, due to the provision of thickness distribution in the second transparent resin layer 11, it becomes possible to absorb the exciting light without losing the exciting light, thus making it possible to obtain a white light source which is high in emission efficiency and almost free from discoloration.

Example 7

In this example, a light-emitting device constructed as shown in FIG. 4 was manufactured.

A blue semiconductor light-emitting element exhibiting an emission peak at a wavelength ranging from 450 to 460 nm and having suitable p/n electrodes was prepared as a semiconductor light-emitting element 3, wherein the light-emitting element was provided with a GaN-based vertical resonator, with a reflecting mirror constituted by an $SiO_2/ZrO_2$ dielectric multi-layer film, and with a light-emitting layer constituted by an InGaN/InGaN multiple quantum well active layer. This semiconductor light-emitting element 3 was then secured to the AlN substrate of package portion 1 using an Au—Sn paste. The lead-out electrode 2a of the anode side was electrically connected with the p-type electrode of the LED chip by an Au wire 4. The lead-out electrode 2b of the cathode side was electrically connected with the n-type electrode of the LED chip by Au—Sn paste.

Using a silicone-based transparent resin, a transparent resin layer 5 was formed on the semiconductor light-emitting element 3. Specifically, first of all, while heating a substrate at a temperature of 150° C. in an air atmosphere and at atmospheric pressure and using a dispenser, a silicone-based transparent resin was coated on the substrate so as to form a layer of an arch-like configuration where a ratio between the thickness of the center portion thereof and the thickness of each of end face portions was approximately 1:1. Thereafter, the resultant body was allowed to dry at atmospheric pressure at a temperature of 150° C. for 10 to 90 minutes to obtain a transparent resin layer 5.

A CASN red fluorescent substance exhibiting an emission peak at a wavelength of 655 nm was dispersed in silicone resin employed as a binder resin to prepare a red fluorescent substance-dispersed resin. While heating the substrate at a temperature of 150° C. in an air atmosphere and at atmospheric pressure and using a dispenser, the red fluorescent substance-dispersed resin was coated so as to entirely cover the transparent resin layer 5 and to form a layer of an arch-like configuration having a uniform thickness. Thereafter, the resultant body was allowed to dry at atmospheric pressure at a temperature of 150° C. for 10 to 90 minutes to obtain a red fluorescent layer 6. In this red fluorescent layer 6, a ratio between the thickness of the center portion thereof and the thickness of each of end face portions was approximately 1:1.

An SOSE yellow fluorescent substance exhibiting an emission peak at a wavelength of 555 nm was dispersed in silicone transparent resin to prepare a yellow fluorescent substance-dispersed resin. While heating the substrate at a temperature of 150° C. in an air atmosphere and at atmospheric pressure, the yellow fluorescent substance-dispersed resin was coated on the red fluorescent layer 6 so as to form a layer of an arch-like configuration where the thickness "i" of the center portion thereof was made larger than the thickness "j" of each of end faces (i.e. i/j=1.5). Thereafter, the resultant body was allowed to dry at atmospheric pressure at a temperature of 150° C. for 10 to 90 minutes to obtain a yellow fluorescent layer 7.

A BCA green fluorescent substance exhibiting an emission peak at a wavelength of 480 nm was dispersed in silicone resin to prepare a green fluorescent substance-dispersed resin. While heating the substrate at a temperature of 150° C. and using a dispenser, the green fluorescent substance-dispersed resin was coated on the yellow fluorescent layer 7 so as to entirely cover the yellow fluorescent layer 7 and to form a layer having an arch-like configuration having a uniform thickness.

Thereafter, the resultant body was allowed to dry at atmospheric pressure at a temperature of 150° C. for 10 to 90 minutes to cure all of these fluorescent layers to obtain a light-emitting device having a construction as shown in FIG. 4. In the green fluorescent layer 8, a ratio between the thickness of the center portion thereof and the thickness of each of end face portions was approximately 1:1.

Comparative Example 10

The same kinds of CASN red fluorescent substance, SOSE yellow fluorescent substance and BCA green fluorescent substance as employed in Example 7 were prepared. Then, all of these three kinds of fluorescent substances were mixed with and dispersed in silicone resin to prepare a mixed fluorescent substance-dispersed resin.

A light-emitting device having a construction as shown in FIG. 9 was prepared in the same manner as described above except that the mixed fluorescent substance-dispersed resin was coated on the transparent resin layer 5 to form a mixed fluorescent layer 10 having an arch-like configuration. Incidentally, in this mixed fluorescent layer 10, a ratio between the thickness of the center portion thereof and the thickness of each of end face portions was approximately 1:1.

Comparative Example 11

The procedures described in Example 7 were repeated in the same manner except that the yellow fluorescent layer 7 was coated uniformly so that the ratio between the thickness "k" of the center portion thereof and the thickness "l" of each of end face portions thereof became 1:1 (i.e. k/l=1), thereby manufacturing a light-emitting device having a construction as shown in FIG. 10.

The light-emitting devices of Example 7, Comparative Example 10 and Comparative Example 11 were investigated with respect to the chromaticity coordinates of luminescent color. As a result, the chromaticity coordinates were (0.33, 0.34) and Ra=86 in the case of Example 7, (0.35, 0.36) and Ra=87 in the case of Comparative Example 10, and (0.38, 0.38) and Ra=78 in the case of Comparative Example 11. Namely, the emission of white light was recognized in all of these examples.

However, with respect to the total luminous flux and emission efficiency, while Example 7 indicated 33 (lm/W), Comparative Example 10 indicated 10 (lm/W) and Comparative Example 11 indicated 29 (lm/W).

The light-emitting device of Example 7 was found more improved in emission efficiency as compared with the light-emitting device of Comparative Examples. For the same reasons as explained in the above-described Example 1, due to the provision of thickness distribution in the yellow fluorescent layer 7, it becomes possible to absorb the exciting light without losing the exciting light, thus making it possible to obtain a white light source which is high in emission efficiency and almost free from discoloration.

Example 8

In this example, a light-emitting device constructed as shown in FIG. 5 was manufactured. By repeating the same procedures as described in Example 7, a transparent resin layer 5 and a red fluorescent layer 6 were formed on the same kind of semiconductor light-emitting element 3 as employed in Example 7.

An SOSE yellow fluorescent substance exhibiting an emission peak at a wavelength of 555 nm was dispersed in silicone resin to prepare a yellow fluorescent substance-dispersed resin. This yellow fluorescent substance-dispersed resin was laminated so as to entirely cover the red fluorescent layer 6 and to form a layer of an arch-like configuration having a uniform thickness, thereby forming a yellow fluorescent layer 7. Then, a second transparent resin layer 11 was formed on the yellow fluorescent layer 7 in such a manner that the thickness "m" of the center portion thereof was made larger than the thickness "n" of each of end faces thereof (i.e. m/n=2).

Further, a silicone resin layer containing a BOA green fluorescent substance exhibiting an emission peak at 480 nm was laminated so as to cover the second transparent resin layer 11, thereby forming a green fluorescent layer 8 having a uniform thickness and an arch-like configuration, thus obtaining the light-emitting device constructed as shown in FIG. 5.

Comparative Example 12

The procedures described in Example 8 were repeated in the same manner except that the second transparent resin layer 11 was coated uniformly so as to create a thickness distribution wherein the ratio between the thickness "o" of the center portion thereof and the thickness "p" of each of end face portions thereof became o/p=1, thereby manufacturing a light-emitting device having a construction as shown in FIG. 11.

The light-emitting devices of Example 8 and Comparative Example 12 were investigated with respect to the chromaticity coordinates of luminescent color. As a result, the chromaticity coordinates were (0.35, 0.38) and Ra=82 in the case of Example 8, and (0.38, 0.38) and Ra=78 in the case of Comparative Example 12. Namely, the emission of white light was recognized in all of these examples.

However, with respect to the emission efficiency, while Example 8 indicated 33 (lm/W), Comparative Example 12 indicated 31 (1 m/W).

The light-emitting device of Example 8 was found more improved in emission efficiency as compared with the light-emitting device of Comparative Example 12. For the same reasons as explained in the aforementioned Example 2, due to the provision of thickness distribution in the second transparent resin layer 11, it becomes possible to absorb the exciting light without losing the exciting light, thus making it possible to obtain a white light source which is high in emission efficiency and almost free from discoloration.

According to the embodiment of the present invention, it is possible to provide a light-emitting device which is capable of realizing a white light source exhibiting a high emission efficiency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A light-emitting device comprising:
 a package having, on a surface thereof, a first portion and a second portion surrounding the first portion;
 a semiconductor light-emitting element mounted on the first portion and emitting a light having an emission peak at a blue color region;
 a first transparent resin layer covering the semiconductor light-emitting element and contacted with the first portion and the second portion, the first transparent resin layer having an arch-like outer profile, as seen in a cross section when cut perpendicularly to the surface; and a laminated body formed on the first transparent resin layer with end faces of the laminated body being contacted with the second portion, the laminated body having an arch-like outer profile, as seen in a cross section when cut perpendicularly to the surface and comprising a red fluorescent layer, a yellow fluorescent layer, a second transparent resin layer and a green fluorescent layer which are laminated in the mentioned order, the second transparent resin layer having a center portion disposed between end face portions, the center portion of the second transparent resin layer having a larger thickness than thicknesses of the end face portions.

2. The device according to claim 1, wherein in the second transparent resin layer, a thickness of the center portion is at least 1.5 times larger than thicknesses of the end face portions.

3. The device according to claim 1, wherein in the second transparent resin layer, a thickness of the center portion is not more than four times larger than thicknesses of the end face portions.

4. The device according to claim 1, wherein in the second transparent resin layer, a thickness of the center portion is twice larger than thicknesses of the end face portions.

5. The device according to claim 1, wherein a wavelength of the light emitted from the semiconductor light-emitting element is confined within the range of 430-480 nm.

* * * * *